US008871572B2

(12) United States Patent
Cruz et al.

(10) Patent No.: US 8,871,572 B2
(45) Date of Patent: Oct. 28, 2014

(54) LEAD FRAME HAVING A PERIMETER RECESS WITHIN PERIPHERY OF COMPONENT TERMINAL

(71) Applicant: Intersil Americas LLC, Milpitas, CA (US)

(72) Inventors: Randolph Cruz, West Melbourne, FL (US); Loyde M. Carpenter, Jr., Palm Bay, FL (US)

(73) Assignee: Intersil Americas LLC, Milpitas, CA (US)

( * ) Notice: Subject to any disclaimer, the term of this patent is extended or adjusted under 35 U.S.C. 154(b) by 36 days.

(21) Appl. No.: 13/722,063

(22) Filed: Dec. 20, 2012

(65) Prior Publication Data

US 2014/0175627 A1 Jun. 26, 2014

(51) Int. Cl.
| H01L 21/00 | (2006.01) |
| H01L 23/495 | (2006.01) |
| H01L 23/00 | (2006.01) |

(52) U.S. Cl.
CPC .......... *H01L 23/49575* (2013.01); *H01L 24/89* (2013.01)
USPC .......................................... 438/123; 438/118

(58) Field of Classification Search
USPC .......................... 438/111, 112, 123, 124, 118
See application file for complete search history.

(56) References Cited

U.S. PATENT DOCUMENTS

| 6,133,634 | A | 10/2000 | Joshi |
| 6,630,726 | B1 | 10/2003 | Crowley et al. |
| 6,943,434 | B2 | 9/2005 | Tangpuz et al. |
| 7,319,266 | B2 | 1/2008 | St. Germain et al. |
| 2006/0170081 | A1* | 8/2006 | Gerber et al. ................. 257/666 |
| 2011/0193208 | A1* | 8/2011 | Xue et al. ...................... 257/676 |
| 2013/0009295 | A1* | 1/2013 | Otremba ....................... 257/676 |
| 2013/0241041 | A1* | 9/2013 | Yu et al. ........................ 257/676 |

* cited by examiner

Primary Examiner — S. V. Clark
(74) Attorney, Agent, or Firm — Fogg & Powers LLC

(57) ABSTRACT

Embodiments described herein relate to manufacturing a device. The method includes etching at least one recess pattern in an internal surface of a lead frame, the at least one recess pattern including a perimeter recess that defines a perimeter of a mounting area. The method also includes attaching a component to the internal surface of the lead frame such that a single terminal of the component is attached in the mounting area and the single terminal covers the perimeter recess, wherein the perimeter recess has a size and shape such that the recess is proximate a perimeter of the single terminal.

12 Claims, 9 Drawing Sheets

LEAD FRAME HAVING A PERIMETER RECESS WITHIN PERIPHERY OF COMPONENT TERMINAL

DETAILED DESCRIPTION

Figure 1A:
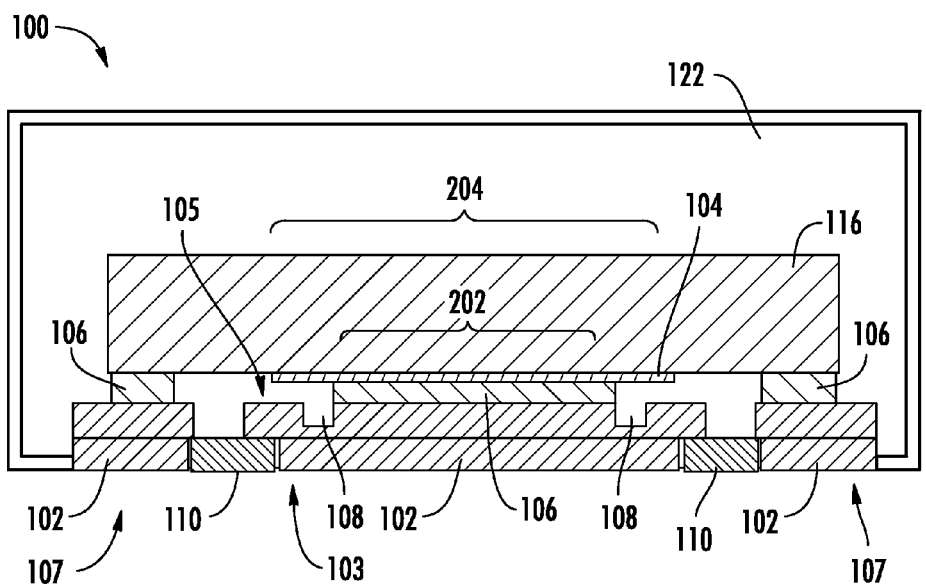
FIG. 1A is a cross-sectional view of an embodiment of a packaged circuit including a lead frame having a perimeter recess within the periphery of a component terminal.

FIG. 1A is a cross-sectional view of an embodiment of a packaged circuit 100 including a lead frame 102 having a perimeter recess 108 within the periphery of a component terminal 104. The lead frame 102 is composed of an electrically conductive material such as a metal. In an example, the lead frame 102 is composed of copper. The lead frame 102 comprises two primary surfaces: an external surface 103 and an internal surface 105. The external surface 103 is the surface that is on the outside of the packaged circuit 100 (after the molding compound has been applied) and includes a plurality of external terminals 107 for coupling the lead frame 102 (and therefore the packaged circuit 100) to external circuits (e.g., a printed circuit board). The internal surface 105 includes one or more pads for mounting of a component 116 and any other active or passive components.

The component 116 is mounted to the internal surface 105 of the lead frame 102. Although the example shown in FIG. 1A illustrates a single component 116, in other examples, additional active or passive components can be mounted to the lead frame 102. In an example, the packaged circuit 100 includes multiple components in a multichip package such as, for example, to implement a power conversion system. The power conversion system can include a power stage as well as a controller and/or driver for the power stage. For example, the component 116 can be encapsulated or non-encapsulated and can include one or more of a high side FET, low side FET, a diode (e.g., Schottky diode), or a driver/controller. Other components such as an inductor or passive die can also be mounted on the lead frame 102. In an example, the power conversion system can comprise one or more of the following: a DC-to-DC power converter, a charger, a hot-swap controller, an AC-DC converter, a bridge driver, a buck converter, a boost converter, a buck-boost converter, a synchronous buck converter, or a portion of any of these circuits. In another example, the packaged circuit 100 includes a single die in a single-chip package such as, for example, to implement a discrete device.

The component 116 includes a terminal 104 on a bottom side thereof for mounting to the internal surface 105 of the lead frame. The terminal 104 can be configured for electrical and/or thermal coupling between the lead frame 102 and the component 116. Accordingly, the terminal 104 comprises a conductive pad on the component 116, which is typically surrounded by non-conductive material. The component 116 can also include other terminals. For pedagogical purposes, only a single terminal 104 of the component 116 is shown, however, it should be understood that the component 116 can have more than one terminal.

A component attach adhesive 106 can be disposed between the terminal 104 and the internal surface 105 of the lead frame 102 to mechanically attach and electrically and/or thermally couple the terminal 104 to the lead frame 102. The component attach adhesive 106 can comprise solder or a conductive or insulating epoxy.

Figure 1B:
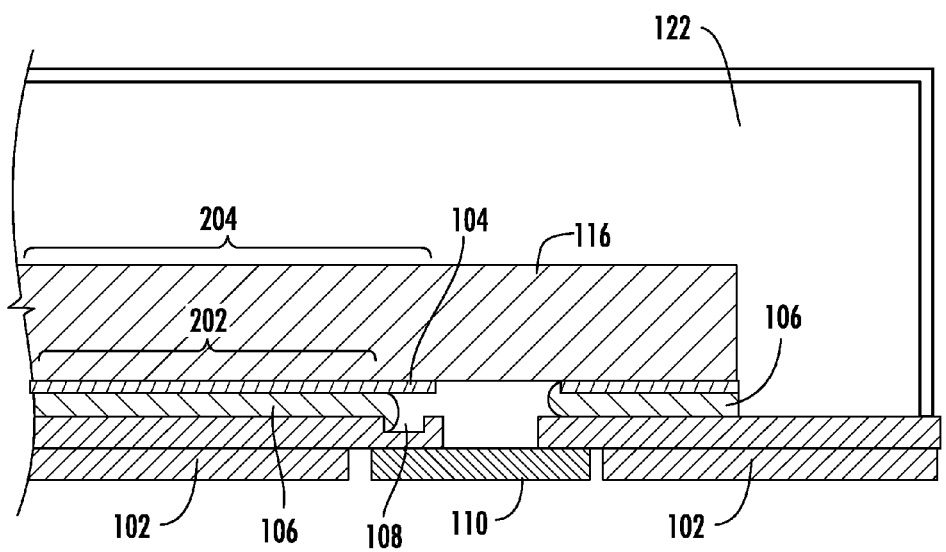
FIG. 1B is an enlarged cross-sectional view of the packaged circuit of FIG. 1A.
Figure 2:
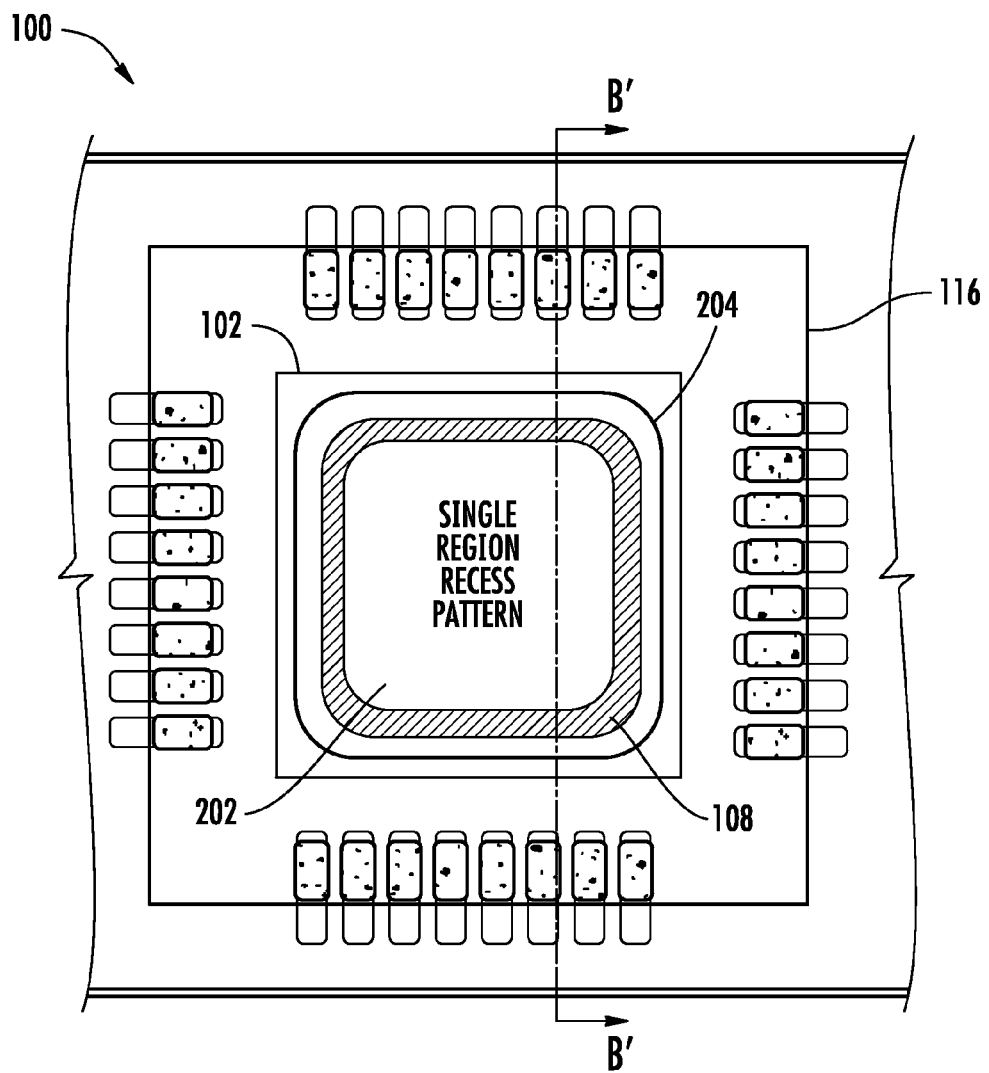
FIG. 2 is a plan view of an embodiment of the packaged circuit of FIGS. 1A and 1B.

The example lead frame 102 shown in FIGS. 1A, 1B, and 2 includes a recess pattern consisting of a perimeter recess 108. For the purposes of this specification, the term recess pattern refers to any recess formed in the internal surface 105 of a lead frame 102 within the periphery of a terminal 104 of a component 104. In the example shown in FIG. 1A, the recess pattern consists of a perimeter recess 108; however, in other examples, the recess pattern can include other recesses within the periphery of a terminal 104, such as shown in FIGS. 5A-8B.

Referring back to FIG. 1A, the perimeter recess 108 comprises a recessed portion (e.g., a trench) in the internal surface 108 of the lead frame 102. Additionally, the perimeter recess 108 has a shape that encloses an area. The area that is enclosed by the perimeter recess 108 on the internal surface 105 of the lead frame 102 is referred to herein as the mounting area 202 and is illustrated in FIG. 2, which shows a top view of the packaged circuit 100. In the example shown in FIG. 2, the perimeter recess 108 has a shape comprising a perimeter of a rectangle (e.g., a square). The mounting area 202, therefore, has a generally rectangular shape as well. In other example, the perimeter recess 108 can have other shapes such as a circle or other polygon. As compared to the perimeter recess 108, the example mounting area 202 of FIG. 2 comprises a raised surface. The terminal 104 of the component 116 is mounted to this raised surface in the mounting area 202. Accordingly, the component attach adhesive 106 is disposed on the raised surface in the mounting area 202 between the terminal 104 and the lead frame 102.

FIG. 1B is an enlarged view of a portion of the packaged circuit 100. As shown, during second level reflow events after manufacture of the packaged circuit 100, the component attach adhesive 106 can soften and expand from the mounting area 202. Such second level reflow events include when the packaged circuit 100 is mounted to a printed circuit board or the like. During these second level reflow events, the recess pattern, including the perimeter recess 108 provides space into which the component attach adhesive 106 can expand, without leaking out of the package. Moreover, as a recess, the perimeter recess 108 provides multiple breaking features including an outer wall surface that impedes the flow of component attach adhesive 106. Thus, as the component attach adhesive 106 expands during a reflow event, the perimeter recess 108 helps contain the component attach adhesive within the periphery of the terminal 104, and therefore, helps reduce or eliminate leakage of the component attach adhesive 106 to the outside of the package. Typically, the recess pattern is used on large terminals having large amounts of component attach adhesive 106. The perimeter recess 108 provides space for the component attach adhesive 106 and impedes the flow of the component attach adhesive 106 on all (e.g., four) sides of the terminal 104.

Notably, the perimeter recess 108 is within the periphery 204 of the terminal 104. That is, when the component 116 is mounted in the mounting area 202, the perimeter 204 of the terminal 104 is larger (i.e., outside of) the outer edge of the perimeter recess 108 and conversely the perimeter recess 108 is underneath and inside of the perimeter 204 of the terminal 104. This is advantageous in that the perimeter recess 108 can be included without using area on the internal surface of the lead frame 102 outward from the terminal 104, enabling such area outward from the terminal 104 to be used for other purposes, such as lead frame locking features. Additionally, this enables the internal surface 105 to be the same size as the periphery 204 of the component 116 while still impeding the flow of component attach adhesive 106. In an example, the outer shape of the perimeter recess 108 on the internal surface 105 is configured to match the shape of the terminal 104 such that when the terminal 104 is mounted in the mounting area 202, the perimeter recess 108 is proximate the perimeter 204 of the terminal 104. Thus, the component attach adhesive 106 used for the terminal 104 is disposed in the mounting area 202 (i.e., internal to the perimeter recess 108) and the perimeter recess 108 provides perimeter containment for the component attach adhesive 106 during first level solder reflow. The terminal 104 is a single terminal and, in some examples, the terminal 104 is coupled to the lead frame 102 only in the mounting area 202. That is, the terminal 104 is not coupled to the lead frame 102 outside of the perimeter recess 108. In addition, in some examples other terminals or interconnect mechanisms (from the same or other components) are not coupled in the mounting area 202. In examples having other terminals, components, and/or interconnect mechanisms attached to the internal surface 105, such other terminals, components, and/or interconnect mechanisms are attached to the internal surface 105 in areas other than (i.e., outside of) the mounting area 202.

A top surface of the component 116 can be coupled to the internal surface 105 of the lead frame 102 by one or more wire bonds 118, copper clip(s), aluminum ribbon(s), or other interconnect mechanism. The wire bonds 118 can be attached to the internal surface 105 of the lead frame 102 and to the top surface of the component 116. Molding compound 122 can surround the component 116 and extend partially around the lead frame 102. The molding compound 122 can comprise any suitable molding compound such as a thermoset, thermoset epoxy, or thermoplastic.

In an example, the lead frame 102 is composed of a plurality of distinct and generally planar sections of conductive material, where the sections are oriented such that the sections collectively have a generally planar configuration. In an example, one or more of the sections of conductive material can be floating, that is, one or more sections of conductive material do not abut an edge (perimeter) of the package of the packaged circuit 100. In such examples, the packaged circuit 100 can include solder resist 110 on a bottom edge thereof in between sections of the lead frame 102. The solder resist 110 can be composed of an electrically non-conductive solder mask material (resist), including both organic and non-organic solder mask material.

Figure 3A:
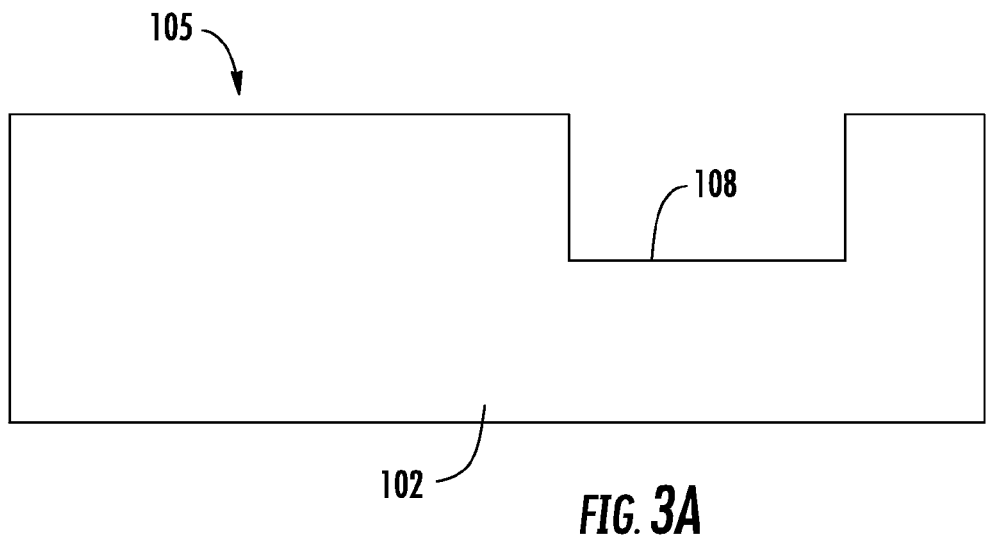
FIG. 3A is an enlarged cross-sectional view of an embodiment of a portion of the lead frame of the packaged circuit in FIGS. 1A and 1B.
Figure 3B:
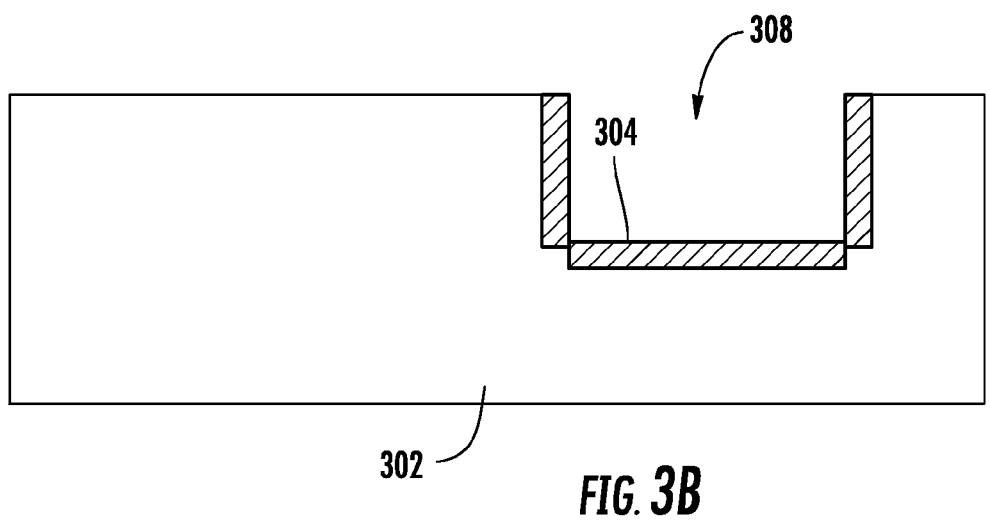
FIG. 3B is an enlarged cross-sectional view of another embodiment of a portion of the lead frame of the packaged circuit in FIGS. 1A and 1B.

FIG. 3A is an enlarged cross-sectional view of a portion of the lead frame 102 showing the perimeter recess 108. In this example, the surface of the perimeter recess 108 is exposed lead frame (e.g., copper). FIG. 3B is an enlarged cross-sectional view of a portion of another example lead frame 302 having a perimeter recess 308. In this example, the perimeter recess 308 is coated with a non-conductive material 304, such as a solder mask material (resist) which can include both organic and non-organic solder mask material. Coating the surface of the perimeter recess 308 with a non-conductive material 304 can reduce wetting of the component attach adhesive 106 during reflow events and aid in allowing the component attach adhesive 106 to retreat back to its former position after a reflow event.

Figure 4B:
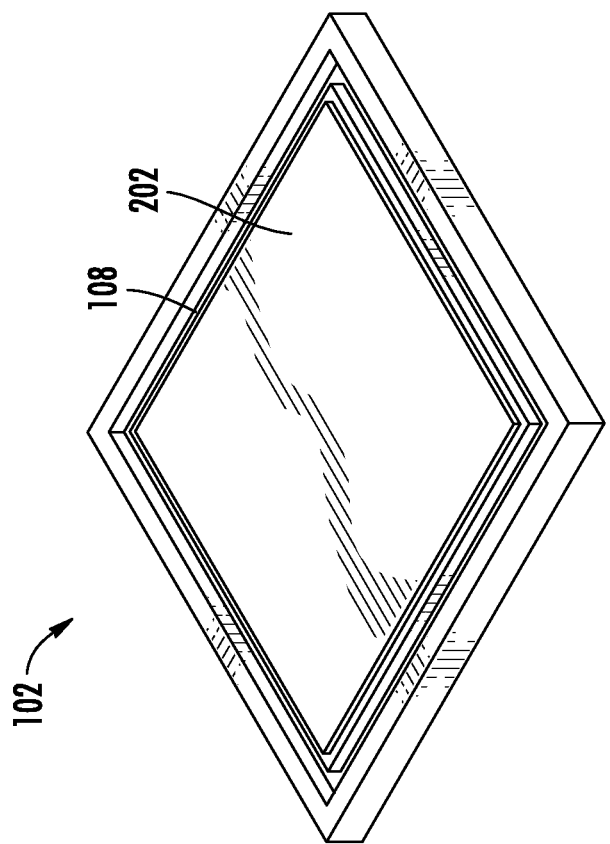
FIG. 4B is a perspective view of the lead frame of FIG. 4A.
Figure 4A:
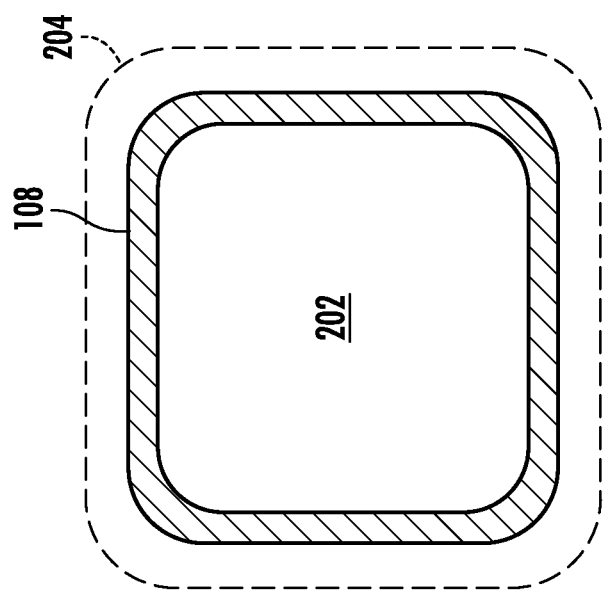
FIG. 4A is a top view of an embodiment of a lead frame having a perimeter recess within the periphery of a component terminal.

FIGS. 4A-8B illustrate different embodiments of a lead frame having various recess patterns. FIGS. 4A and 4B illustrate the lead frame 102 shown in FIGS. 1A, 1B, and 2. As shown, the lead frame 102 includes a recess pattern comprising a perimeter recess 108 that defines a perimeter around the mounting area 202. The perimeter recess 108 defines the mounting area 202 as a single raised surface to which the terminal 104 is mounted. The single raised surface of the mounting area 202 is coated with a component attach adhesive for mounting of the terminal 104. The perimeter 204 of the terminal 104 extends outward from the perimeter recess 108.

Figure 5B:
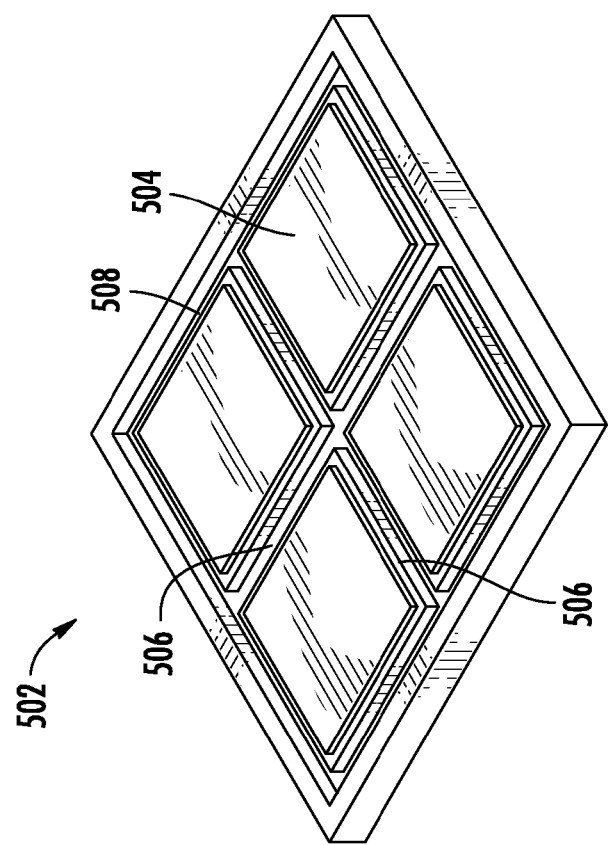
FIG. 5B is a perspective view of the lead frame of FIG. 5A.
Figure 5A:
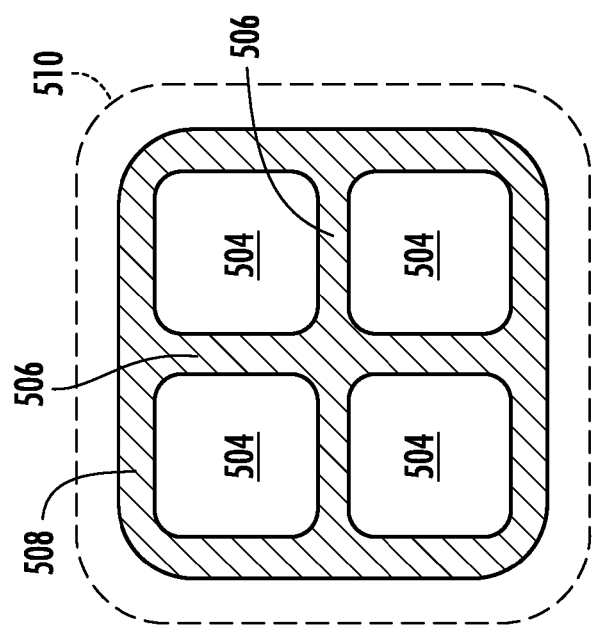
FIG. 5A is a top view of another embodiment of a lead frame having a perimeter recess within the periphery of a component terminal.

FIGS. 5A and 5B illustrate another example of a lead frame 502. The lead frame 502 includes a recess pattern including a perimeter recess 508 and a plurality of cross recesses 506. The perimeter recess 508 defines a perimeter around a plurality of raised surfaces 504 in the mounting area. The plurality of raised surfaces 504 are defined by the perimeter recess 508 and two cross-recesses 506 that extend across the mounting area. Similar to the perimeter recess 508, the cross-recesses 506 are recess in the internal surface of the lead frame 502. The cross-recesses 506 are in the area enclosed by the perimeter recess 508, where the perimeter recess 508 comprises the outer loop portion of the recesses shown in FIGS. 5A and 5B. In this example, the cross-recesses 506 extend all the way across the area enclosed by the perimeter recess 508 such that they terminate at each end at the perimeter recess 508. In this example, the cross-recesses 506 extend perpendicular to one another forming a cross that results in four generally equally sized raised surfaces 504. The four raised surfaces 504 are coated with component attach adhesive and the terminal 104 can be attached thereto. The perimeter 510 of the terminal 104 extends outward from the perimeter recess 508. Advantageously, the cross-recesses 506 provide additional space within the periphery of the terminal 104 into which the component attach adhesive can expand during reflow events.

Figure 6B:
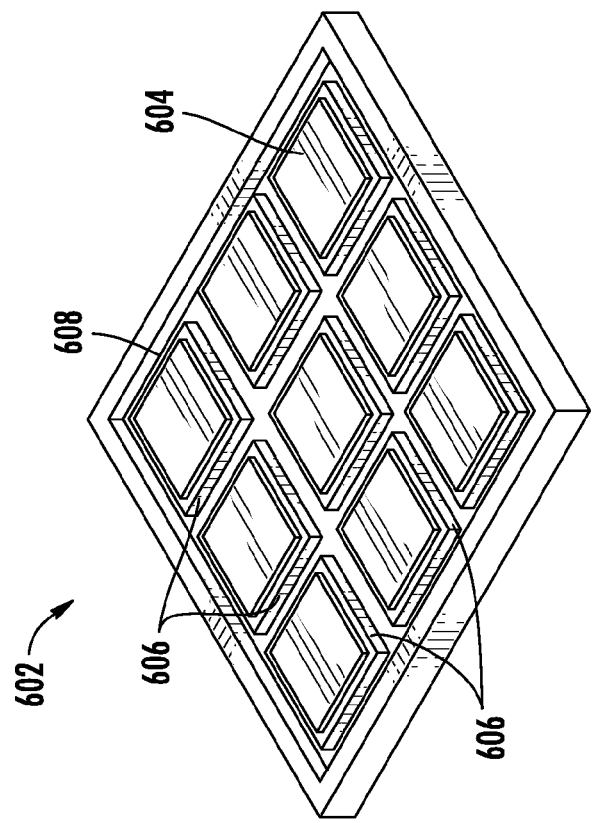
FIG. 6B is a perspective view of the lead frame of FIG. 6A.
Figure 6A:
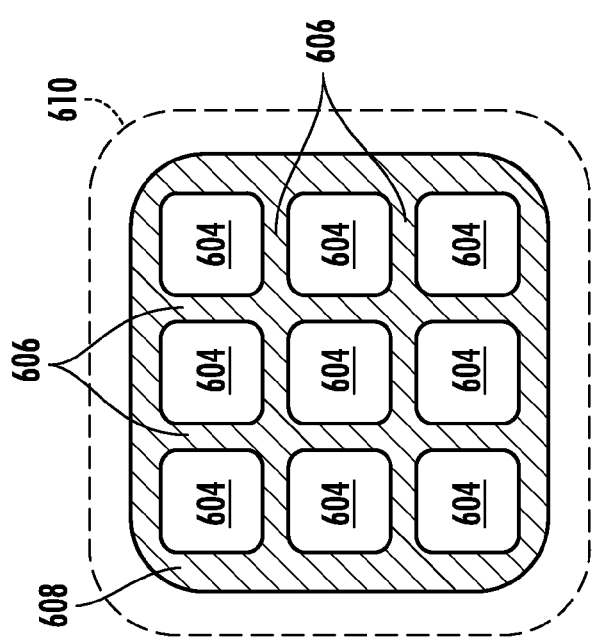
FIG. 6A is a top view of yet another embodiment of a lead frame having a perimeter recess within the periphery of a component terminal.

FIGS. 6A and 6B illustrate yet another example of a lead frame 602. The lead frame 602 includes a recess pattern including a perimeter recess 608 and a plurality of cross recesses 606. The perimeter recess 608 defines a perimeter around a plurality of raised surfaces 604 in the mounting area. The plurality of raised surfaces 604 are defined by the perimeter recess 608 and the four cross-recesses 606 that extend across the mounting area. Similar to the perimeter recess 608, the cross-recesses 606 are recess in the internal surface of the lead frame 602. The cross-recesses 606 are in the area enclosed by the perimeter recess 608, where the perimeter recess 608 comprises the outer loop portion of the recesses shown in FIGS. 6A and 6B. In this example, the cross-recesses 606 extend all the way across the area enclosed by the perimeter recess 608 such that they terminate at each end at the perimeter recess 608. In this example, two cross-recesses 606 extend perpendicular to two other cross-recesses 606 forming a tick-tack-toe board pattern that results in six generally equally sized raised surfaces 604. The six raised surfaces 604 are coated with component attach adhesive and the terminal 104 can be attached thereto. The perimeter 610 of the terminal 104 extends outward from the perimeter recess 608. Advantageously, the cross-recesses 606 provide additional space within the periphery of the terminal 104 into which the component attach adhesive can expand during reflow events.

Figure 7B:
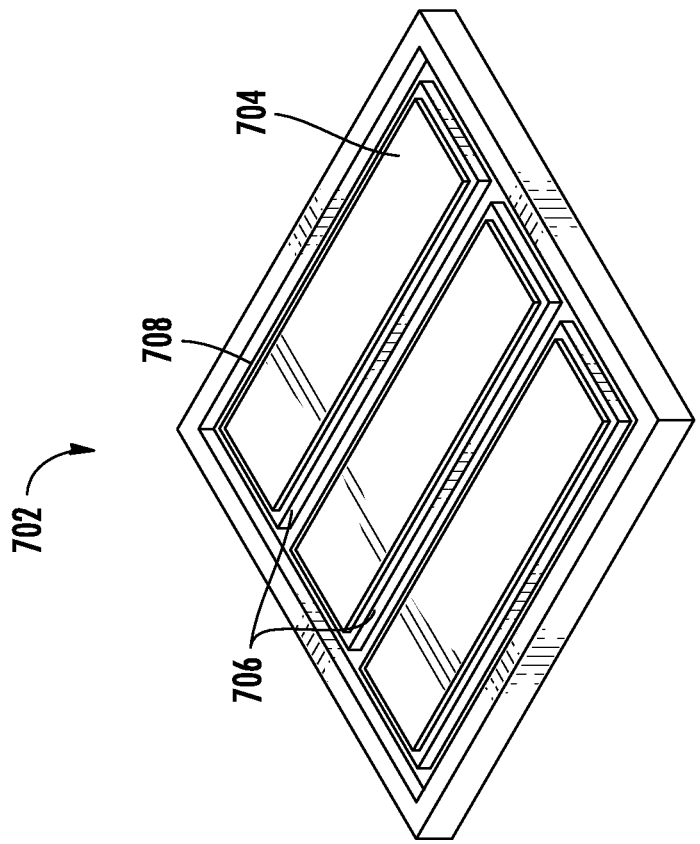
FIG. 7B is a perspective view of the lead frame of FIG. 7A.
Figure 7A:
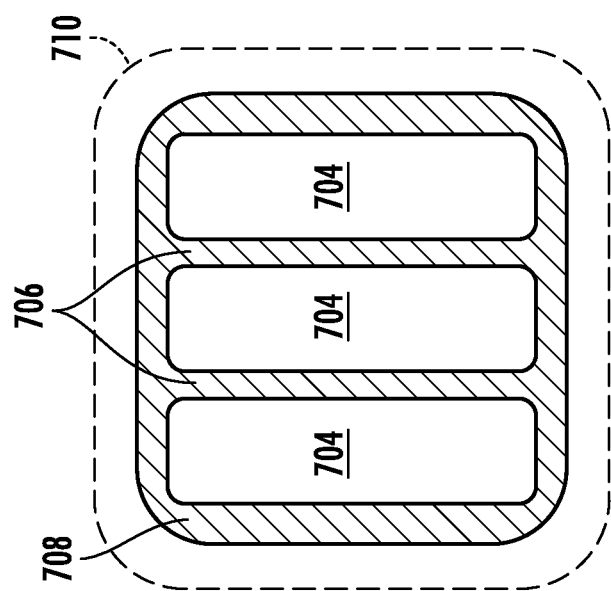
FIG. 7A is a top view of still another embodiment of a lead frame having a perimeter recess within the periphery of a component terminal.

FIGS. 7A and 7B illustrate still another example of a lead frame 702. The lead frame 702 includes a recess pattern including a perimeter recess 708 and a plurality of cross recesses 706. The perimeter recess 708 defines a perimeter around a plurality of raised surfaces 704 in the mounting area. The plurality of raised surfaces 704 are defined by the perimeter recess 708 and two cross-recesses 706 that extend across the mounting area. Similar to the perimeter recess 708, the cross-recesses 706 are recess in the internal surface of the lead frame 702. The cross-recesses 706 are in the area enclosed by the perimeter recess 708, where the perimeter recess 708 comprises the outer loop portion of the recesses shown in FIGS. 7A and 7B. In this example, the cross-recesses 706 extend all the way across the area enclosed by the perimeter recess 708 such that they terminate at each end at the perimeter recess 708. In this example, the two cross-recesses 706 extend parallel to one another resulting in three rectangular and equally sized raised surfaces 704. The three raised surfaces 704 are coated with component attach adhesive and the terminal 104 can be attached thereto. The perimeter 710 of the terminal 104 extends outward from the perimeter recess 708. Advantageously, the cross-recesses 706 provide additional space within the periphery of the terminal 104 into which the component attach adhesive can expand during reflow events.

Figure 8B:
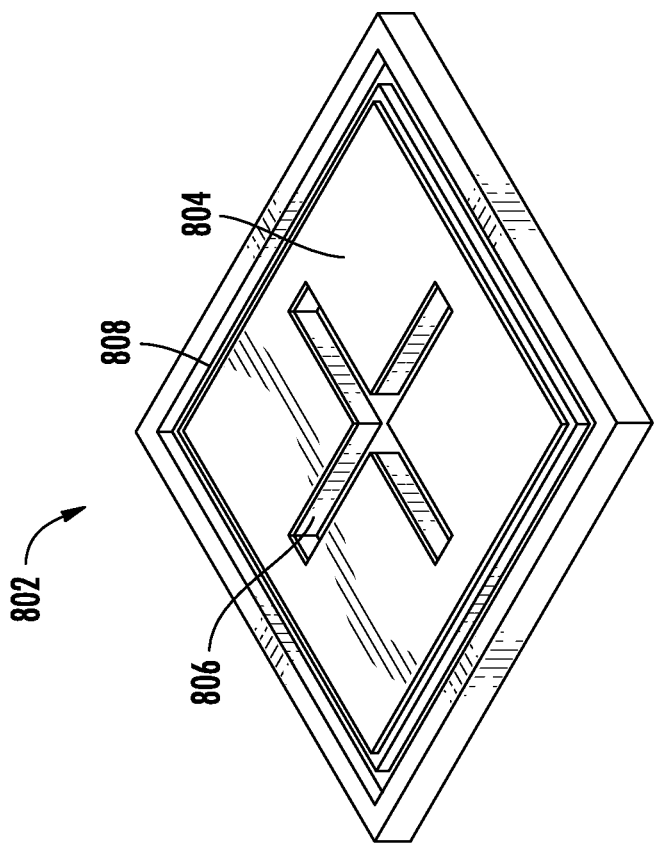
FIG. 8B is a perspective view of the lead frame of FIG. 8A.
Figure 8A:
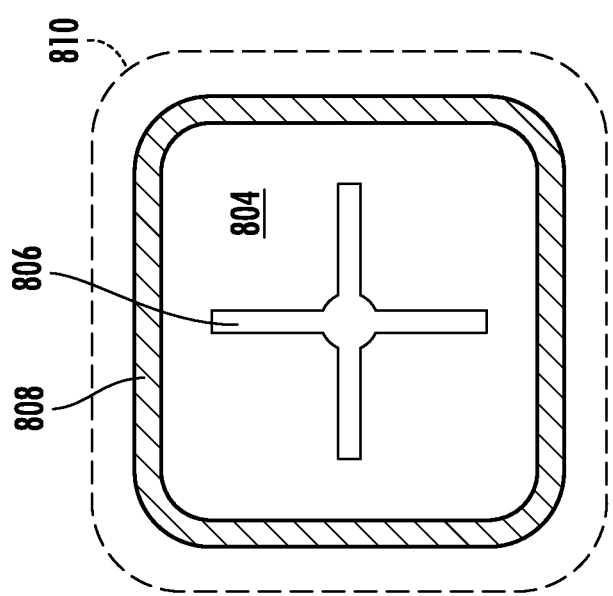
FIG. 8A is a top view of another embodiment of a lead frame having a perimeter recess within the periphery of a component terminal.

FIGS. 8A and 8B illustrate another example of a lead frame 802. The lead frame 802 includes a recess pattern including a perimeter recess 808 and a plurality of cross recesses 806. The perimeter recess 808 defines a perimeter around a single raised surface 804 in the mounting area. The raised surface 804 is defined by the perimeter recess 808. The raised surface 804 includes a cross-recess portion 806 therein. Similar to the perimeter recess 808, the cross-recess 806 is a recess in the internal surface of the lead frame 802. The cross-recess 806 is in the area enclosed by the perimeter recess 808. In this example, the cross-recess 806 does not connect with the perimeter recess 808, and instead define an island recess in the area enclosed by the perimeter recess 808. Such an island recess can be air filled after the component 116 is mounted overtop. In this example, the cross-recess 806 is in the shape of a cross; however, other shapes can also be used. The raised surface 804 is coated with component attach adhesive and the terminal 104 can be attached thereto. The perimeter 810 of the terminal 104 extends outward from the perimeter recess 808. Advantageously, the cross-recess 806 provide additional space within the periphery of the terminal 104 into which the component attach adhesive can expand during reflow events.

In an example, the clearance between the edge of a perimeter recess and the edge of a lead frame or a section thereof is at least 0.10 mm. In an example, a perimeter recess extends at least 0.063 mm below the internal surface of the lead frame. In an example, the clearance between two adjacent recesses (e.g., a perimeter recess and a cross-recess) is at least 0.50 mm. In an example, a width of a recess (e.g., a perimeter recess and a cross-recess) is at least 0.10 mm. Any of the above recesses (e.g., a perimeter recess and a cross-recess) can be filled with molding compound, air, or partially filled with both after encapsulation of the packaged circuit 100.

Manufacturing the circuit 100 into a package can include manufacturing a plurality of the packaged circuits 100 at the same time. For example, a plurality of lead frames 102 can be assembled adjacent to one another, each having appropriate components (116) mounted thereon. Once assembled, the lead frames 102 and associated components can be singulated to form the individual packaged systems. The following description refers to the process of forming a single packaged circuit 100, but it should be understood that the process can involve forming a plurality of packaged circuits 100 at the same time.

Figure 9:
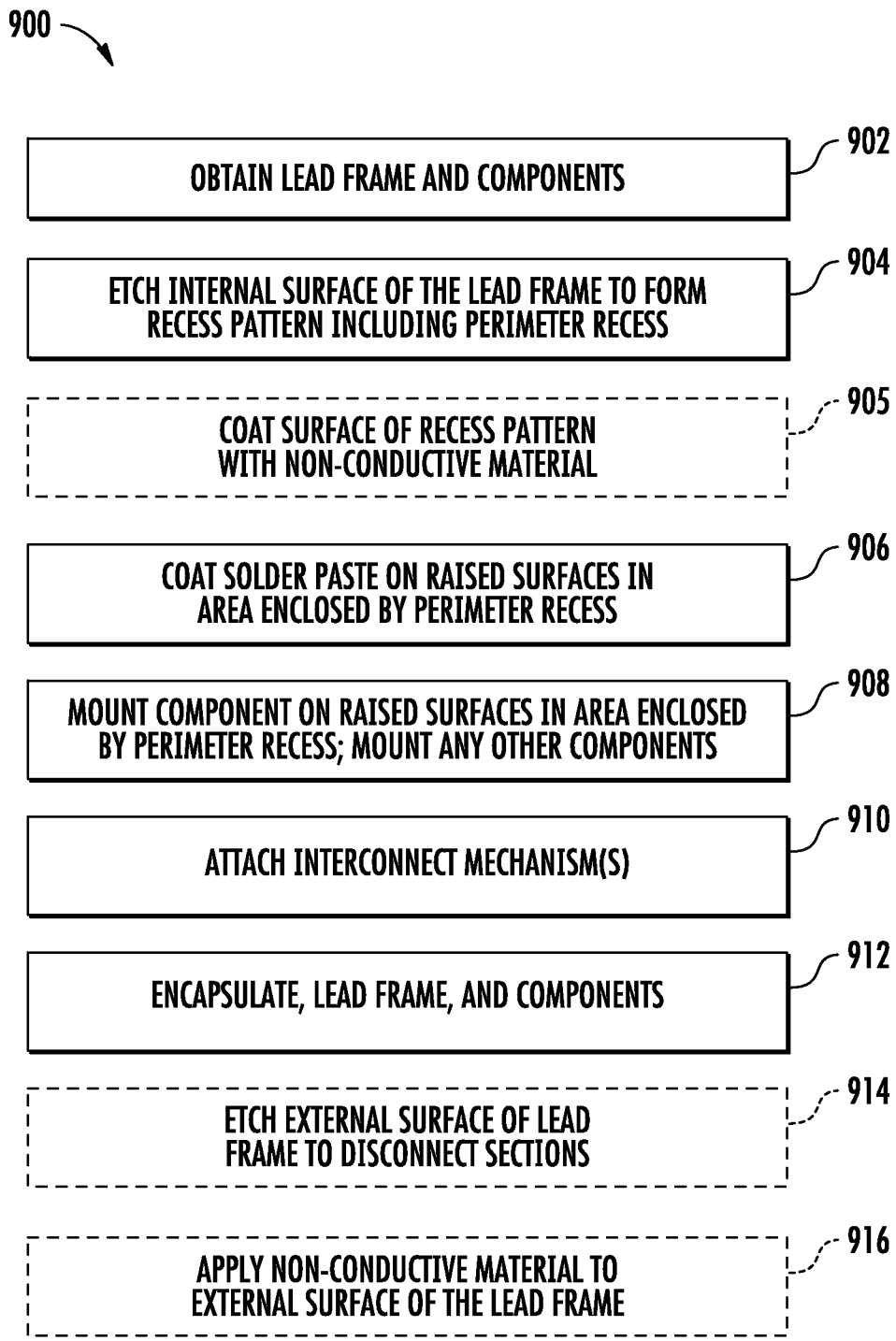
FIG. 9 is a flow diagram of an example method of manufacturing a packaged circuit having a perimeter recess defined in a lead frame.

FIG. 9 is a flow diagram of an example method 900 of manufacturing a packaged circuit having a lead frame 102 with a recess pattern including a perimeter recess 108. The lead frame 102, the component 116, and any other components to be mounted on the lead frame 102 are obtained (block 902). The component 116 and any other components can include high side FET, low side FET, a diode (e.g., Schottky diode), a driver/controller, an inductor, or a passive die as well as others. In examples including one or more dies (e.g., a monolithic substrate), such one or more dies can be fabricated using appropriate semiconductor processes.

The lead frame 102 can be partially etched from the internal (top) surface 105 according to the desired recess pattern (block 904). The recess pattern can include a perimeter recess 108 as well as any cross-recesses in the area enclosed by the perimeter recess 108. The partial etch extends only a portion of the way through the lead frame 102 from the internal surface 105 toward the external (bottom) surface 103. The partial etch results in a lead frame 102 having a recess pattern defined in the internal surface 105. To perform the partial etch, resist is placed on the internal surface 105 of the lead frame 102, but resist is not placed on portions where the lead frame 102 is to be removed with the etch. In an example, the partial etch extends between 25 and 60% of the way through the lead frame 102. In examples where the recess pattern includes a coating of non-conductive material, such non-conductive material can be applied to the recesses of the recess pattern. In other examples, the partial etch can extend in other distances. After the partial etch, plating can be deposited on the internal surface 105 of the lead frame 102.

In some examples, the surfaces of the recess pattern can be coated with non-conductive material 304 (block 905).

The internal surface 105 of the lead frame 102 can be coated with the solder paste 106 using a solder mask and solder paint or a plurality of solder balls (block 906). This can include coating the raised surface(s) in the mounting area enclosed by the perimeter recess 108 with solder paste.

The component 116 can be mounted on the solder paste 106 of the raised surfaces of the lead frame 102 (block 908). The component 116 can be aligned with and placed on the lead frame 102, for example, using flip-chip mounting techniques. In particular, the component 116 can be placed such that the terminal 104 covers the recess pattern and the perimeter 204 is disposed outward of the perimeter recess 108. In examples including other components, the other components can be mounted to the internal surface 105 of the lead frame 102 as well. In some examples, the solder 106 can be reflowed once the component 116 and any other components are in position on the lead frame 102.

In some examples, wire bond(s) 118, copper clip(s), aluminum ribbon(s), or other interconnect mechanism can be attached to the component 116, other components, and/or the lead frame 102 to achieve desired coupling (block 910). Once the component 116 and any other components have been mounted and all appropriate electrical connections have been made, molding compound 122 can be flowed over the component 116, any other components, and the lead frame 102 to encapsulate the component 116, any other components, and the lead frame 102 (block 912). In a process forming a plurality of packaged circuits at the same time, molding compound 122 can be flowed over the plurality of assembled circuits. Once applied, the molding compound 122 can be cured or solidified.

A lead frame having a recess loop defined in an internal surface can be included in any appropriate package technology. For example, the lead frame can be included in a package having a single piece lead frame, or can be included in a package where the lead frame is composed of a plurality of distinct and electrically isolated sections of conductive material.

In examples where the lead frame is composed of a plurality of sections of material, any of the sections can be etched to include a recess loop and any cross-recesses as desired (block 914). In such examples, the process of manufacturing the packaged circuit can include, in addition to the acts above, a partial etch of the internal surface 105 of the lead frame 102 along dividing lines, which correspond to the spaces between sections of the final lead frame 102. Once the molding compound 122 is cured, the external surface 103 of the lead frame 102 can be etched at the dividing lines between future sections of the lead frame 102. This partial etch extends a portion of the way through the lead frame from the external surface 103 toward the internal surface 105. The partial etch on the external surface 103 can be aligned with the partial etch on the internal surface 105 such that the combination of etches disconnect and electrically de-couple different sections of the lead frame 102 at the dividing lines.

In an example, an electrically non-conductive material, such as a solder mask material (e.g., resist) 110 can be applied to the external surface 103 of the lead frame 102 (block 916). The solder mask material can include organic and non-organic solder mask material. Additionally, input/output land plating, solder, or the like can be applied to the external surface 103 of the lead frame 102.

When forming a plurality of packaged circuits at the same time, the combined multiple packaged circuits can then be singulated to form a plurality of packaged circuits.

The directional references top and bottom stated and illustrated in this application should not be taken as limiting. The directions top and bottom are merely illustrative and do not correspond to absolute orientations. That is, a "top" or "bottom" surface refers merely to a relative orientation with respect to the lead frame and is not an absolute direction. For example, in actual electronic applications, a packaged circuit may well be turned on its "side", causing the "bottom surface" described herein to face sidewise.

EXAMPLE EMBODIMENTS

Example 1 includes a method of manufacturing a device, the method comprising: etching at least one recess pattern in an internal surface of a lead frame, the at least one recess pattern including a perimeter recess that defines a perimeter of a mounting area; and attaching a component to the internal surface of the lead frame such that a single terminal of the component is attached in the mounting area and the single terminal covers the perimeter recess, wherein the perimeter recess has a size and shape such that the recess is proximate a perimeter of the single terminal.

Example 2 includes the method of Example 1, wherein the single terminal of the component comprises an electrically conductive pad on the component.

Example 3 includes the method of any of Examples 1 or 2, comprising: attaching one or more other components to the internal surface of the lead frame outside of the mounting area.

Example 4 includes the method of any of Examples 1-3, wherein the perimeter recess has a shape of a perimeter of a rectangle.

Example 5 includes the method of any of Examples 1-4, wherein the mounting area comprises a single raised surface.

Example 6 includes the method of any of Examples 1-5, wherein etching the at least one recess pattern comprises etching one or more cross-recesses extending across the mounting area, thereby dividing the mounting area into multiple raised surfaces.

Example 7 includes the method of any of Examples 1-6, wherein the one or more cross-recesses terminate on each end by connecting with the perimeter recess.

Example 8 includes the method of any of Examples 1-7, comprising: placing component attach adhesive on one or more raised surfaces in the mounting area; and applying molding compound on the lead frame and around the component.

Example 9 includes a packaged circuit comprising: a lead frame including at least one recess pattern on an internal surface thereof, the at least one recess pattern including a perimeter recess that defines a perimeter around one or more raised surfaces; a component having one or more terminals, one of the terminals mounted to the one or more raised surfaces such that the terminal covers the perimeter recess, wherein the perimeter recess has a size and shape such that the recess is proximate a perimeter of the terminal; and component attach adhesive between the single terminal of the component and the one or more raised surfaces of the lead frame.

Example 10 includes the packaged circuit of Example 9, wherein the terminal of the component comprises an electrically conductive pad on the component.

Example 11 includes the packaged circuit of Example 10, wherein the electrically conductive pad is surrounding by non-conductive material.

Example 12 includes the packaged circuit of any of Example 9-11, wherein the perimeter recess has a shape of a perimeter of a rectangle.

Example 13 includes the packaged circuit of any of Examples 9-12, wherein the one or more raised surfaces include a single raised surface.

Example 14 includes the packaged circuit of any of Examples 9-13, wherein the at least one recess pattern includes one or more cross-recesses internal to the perimeter recess, such that the one or more raised surfaces include multiple raised surfaces.

Example 15 includes the packaged circuit of any of Examples 9-14, wherein the one or more cross-recesses terminate on each end by connecting with the perimeter recess.

Example 16 includes the packaged circuit of any of Examples 9-15, comprising: component attach adhesive on the one or more raised surfaces between the lead frame and the component.

Example 17 includes a method of manufacturing a device, the method comprising: etching a recess pattern in an internal surface of a lead frame, the recess pattern including a perimeter recess that defines a perimeter around one or more raised surfaces; placing component attach adhesive on the one or more raised surfaces; attaching a component to the internal surface of the lead frame such that a single terminal of the component is attached to the one or more raised surfaces and the single terminal covers the perimeter recess, wherein the perimeter recess has a size and shape such that the recess is proximate a perimeter of the single terminal; and applying molding compound on the lead frame and around the component.

Example 18 includes the method of Example 17, wherein the one or more raised surfaces comprise a single surface making up the entire area internal to the perimeter recess.

Example 19 includes the method of any of Examples 17 or 18, wherein etching the recess pattern comprises etching one or more cross-recesses internal to the perimeter recess, such that the one or more raised surfaces include multiple raised surfaces.

Example 20 includes the method of any of Examples 17-19, wherein the perimeter recess has a shape of a perimeter of a rectangle.

What is claimed is:

1. A method of manufacturing a device, the method comprising:
    etching at least one recess pattern in an internal surface of a lead frame, the at least one recess pattern including a perimeter recess that defines a perimeter of a mounting area;
    placing component attach adhesive on one or more raised surfaces in the mounting area; and
    attaching a component to the internal surface of the lead frame such that a single terminal of the component is attached in the mounting area and the single terminal covers the perimeter recess, wherein the perimeter recess has a size and shape such that the recess is proximate a perimeter of the single terminal, wherein the perimeter recess defines a continuous outer wall to impede flow of the component attach adhesive.

2. The method of claim 1, wherein the single terminal of the component comprises an electrically conductive pad on the component.

3. The method of claim 1, comprising:
    attaching one or more other components to the internal surface of the lead frame outside of the mounting area.

4. The method of claim 1, wherein the perimeter recess has a shape of a perimeter of a rectangle.

5. The method of claim 1, wherein the mounting area comprises a single raised surface.

6. The method of claim 1, wherein etching the at least one recess pattern comprises etching one or more cross-recesses extending across the mounting area, thereby dividing the mounting area into multiple raised surfaces.

7. The method of claim 1, wherein the one or more cross-recesses terminate on each end by connecting with the perimeter recess.

8. The method of claim 1, comprising:
    applying molding compound on the lead frame and around the component.

9. A method of manufacturing a device, the method comprising:
    etching a recess pattern in an internal surface of a lead frame, the recess pattern including a perimeter recess that defines a perimeter around one or more raised surfaces;
    placing component attach adhesive on the one or more raised surfaces;
    attaching a component to the internal surface of the lead frame such that a single terminal of the component is attached to the one or more raised surfaces and the single terminal covers the perimeter recess, wherein the perimeter recess has a size and shape such that the recess is proximate a perimeter of the single terminal, wherein the perimeter recess provides space into which the component attach adhesive can expand; and
    applying molding compound on the lead frame and around the component.

10. The method of claim 9, wherein the one or more raised surfaces comprise a single surface making up the entire area internal to the perimeter recess.

11. The method of claim 9, wherein etching the recess pattern comprises etching one or more cross-recesses internal to the perimeter recess, such that the one or more raised surfaces include multiple raised surfaces.

12. The method of claim 9, wherein the perimeter recess has a shape of a perimeter of a rectangle.

* * * * *